United States Patent
Mutnury et al.

(10) Patent No.: US 9,930,771 B2
(45) Date of Patent: Mar. 27, 2018

(54) APERIODIC ROUTING TO MITIGATE FLOQUET MODE RESONANCES

(71) Applicant: Dell Products, LP, Round Rock, TX (US)

(72) Inventors: Bhyrav M. Mutnury, Round Rock, TX (US); Arun R. Chada, Round Rock, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 134 days.

(21) Appl. No.: 14/971,193

(22) Filed: Dec. 16, 2015

(65) Prior Publication Data

US 2017/0181269 A1 Jun. 22, 2017

(51) Int. Cl.
*H05K 1/02* (2006.01)
*H01P 1/02* (2006.01)
*H01P 3/02* (2006.01)
*H01P 11/00* (2006.01)

(52) U.S. Cl.
CPC .............. *H05K 1/0228* (2013.01); *H01P 3/02* (2013.01); *H01P 11/003* (2013.01); *H05K 2201/09263* (2013.01); *H05K 2201/09672* (2013.01)

(58) Field of Classification Search
CPC ...... H05K 1/0228; H05K 1/0296; H01P 3/02; H01P 3/08; H01P 3/081
USPC .............................. 333/1, 156, 236, 245, 246
See application file for complete search history.

(56) References Cited

U.S. PATENT DOCUMENTS

| | | | |
|---|---|---|---|
| 4,785,135 A * | 11/1988 | Ecker | H05K 1/0228 174/34 |
| 5,335,985 A | 8/1994 | Baur | |
| 5,434,775 A | 7/1995 | Sims et al. | |
| 5,505,533 A | 4/1996 | Kammersqard et al. | |
| 5,774,668 A | 6/1998 | Choquier et al. | |
| 5,805,442 A | 9/1998 | Crater et al. | |
| 5,869,820 A | 2/1999 | Chen et al. | |
| 5,910,776 A | 6/1999 | Black | |
| 5,913,034 A | 6/1999 | Malcolm | |
| 5,926,463 A | 7/1999 | Ahearn et al. | |
| 5,956,665 A | 9/1999 | Martinez et al. | |
| 5,956,723 A | 9/1999 | Zhu | |
| 5,959,012 A | 9/1999 | Simonian et al. | |
| 6,057,512 A * | 5/2000 | Noda | H05K 1/0228 174/250 |
| 6,057,981 A | 5/2000 | Fish et al. | |
| 6,112,246 A | 8/2000 | Horbal et al. | |
| 6,131,119 A | 10/2000 | Fukui | |
| 6,167,448 A | 12/2000 | Hemphill et al. | |
| 6,282,175 B1 | 8/2001 | Steele et al. | |
| 6,601,084 B1 | 7/2003 | Bhaskaran et al. | |

(Continued)

*Primary Examiner* — Dean Takaoka
*Assistant Examiner* — Alan Wong
(74) *Attorney, Agent, or Firm* — Larson Newman, LLP (57) ABSTRACT

A trace route including a first signal route to couple a first signal transmitter to a first signal receiver. The first signal route including a first signal route section coupled to the transmitter and configured in a first zig-zag pattern, the first zig-zag pattern including a first unit cell having a first unit cell length, and a second signal route section connected to the first signal route section and coupled to the receiver, and configured in a second zig-zag pattern, the second zig-zag pattern comprising a second unit cell having a second unit cell length, the first unit cell length is less than the second unit cell length.

16 Claims, 9 Drawing Sheets

(56) References Cited

U.S. PATENT DOCUMENTS

| | | | |
|---|---|---|---|
| 6,611,181 B2 * | 8/2003 | Marketkar | H01P 5/185 333/109 |
| 6,654,347 B1 | 11/2003 | Wiedeman et al. | |
| 6,714,977 B1 | 3/2004 | Fowler et al. | |
| 6,826,714 B2 | 11/2004 | Coffey et al. | |
| 6,959,533 B2 * | 11/2005 | Noel, Jr. | H01B 13/0214 57/62 |
| 7,450,636 B2 | 11/2008 | Lee et al. | |
| 7,696,506 B2 | 4/2010 | Lung | |
| 7,720,987 B2 | 5/2010 | Penk et al. | |
| 8,031,763 B2 | 10/2011 | Sumesaglam | |
| 8,037,330 B2 | 10/2011 | Livescu et al. | |
| 8,384,489 B2 * | 2/2013 | Park | H01P 3/081 333/1 |
| 8,588,288 B2 | 11/2013 | Witt | |
| 8,732,508 B2 | 5/2014 | Cochran et al. | |
| 8,767,531 B2 * | 7/2014 | Ferraiolo | H04L 1/22 370/225 |
| 9,655,231 B2 * | 5/2017 | Hidaka | H05K 3/0091 |
| 2002/0095487 A1 | 7/2002 | Day et al. | |
| 2002/0141210 A1 | 10/2002 | Glannopoulos et al. | |
| 2003/0046339 A1 | 3/2003 | Ip | |
| 2004/0010649 A1 | 1/2004 | Weaver et al. | |
| 2004/0013188 A1 | 1/2004 | Tonietto et al. | |
| 2006/0182172 A1 | 8/2006 | Lin | |
| 2007/0094426 A1 | 4/2007 | Chiang et al. | |
| 2008/0304557 A1 | 12/2008 | Hollis | |
| 2008/0317021 A1 | 12/2008 | Ives et al. | |
| 2009/0189774 A1 | 7/2009 | Brundridge et al. | |
| 2009/0217073 A1 | 8/2009 | Brech et al. | |
| 2009/0307515 A1 | 12/2009 | Bandholz et al. | |
| 2010/0027687 A1 | 2/2010 | De Natale et al. | |
| 2010/0106154 A1 | 4/2010 | Harlev et al. | |
| 2011/0022245 A1 | 7/2011 | Goodrum et al. | |
| 2011/0179301 A1 | 7/2011 | Liu et al. | |
| 2012/0170638 A1 | 7/2012 | Chen | |
| 2012/0262956 A1 | 10/2012 | DeHaven | |
| 2012/0303767 A1 | 11/2012 | Renzin | |
| 2013/0007249 A1 | 1/2013 | Wang et al. | |
| 2013/0169314 A1 | 7/2013 | Choudhary et al. | |
| 2014/0269881 A1 | 9/2014 | He et al. | |
| 2014/0312953 A1 | 10/2014 | Song | |

* cited by examiner

APERIODIC ROUTING TO MITIGATE FLOQUET MODE RESONANCES

FIELD OF THE DISCLOSURE

This disclosure generally relates to information handling systems, and more particularly relates to aperiodic routing for trace route signals to mitigate floquet mode resonances.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

A printed circuit board for an information handling system can utilize broadside stack-ups, with two or more routing layers stacked between the power plane layers. In this way, the number of routing layers is increased for the same overall number of layers in the printed circuit board stack-up. A printed circuit board using broadside stack-ups can suffer adverse coupling effects between the stacked routing layers. For this reason, circuit traces can be angularly routed in a printed circuit board, that is, routed in a zigzag pattern, to mitigate the coupling effects. However, angular routing can result in floquet mode coupling, that is, resonant coupling based upon the periodicity of the angularly routed circuit traces. Floquet mode coupling leads to undesirable insertion loss and crosstalk in the signals carried by the angularly routed circuit traces.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of an information handling system can include one or more storage devices that can store machine-executable code, one or more communications ports for communicating with external devices, and various input and output (I/O) devices, such as a keyboard, a mouse, and a video display. An information handling system can also include one or more buses operable to transmit information between the various hardware components.

Figure 1:
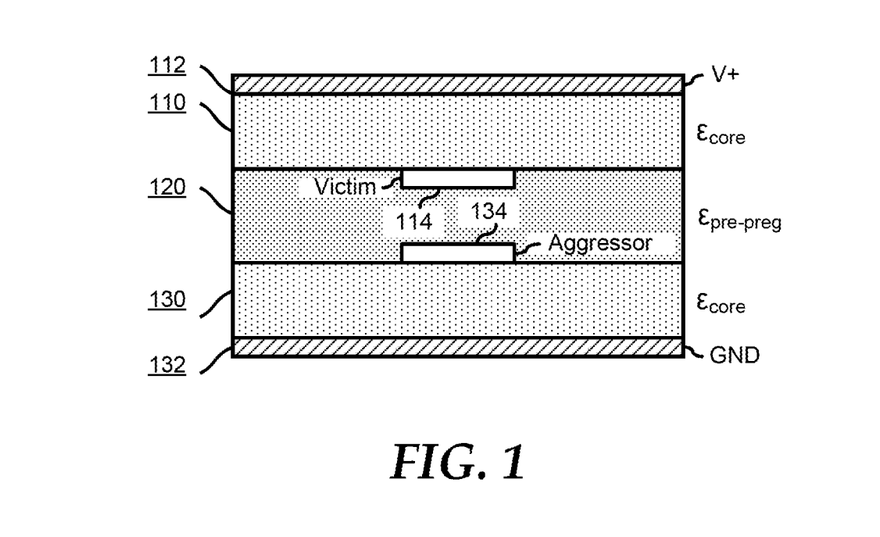
FIG. 1 illustrates a printed circuit board that utilizes a broadside stack-up according to an embodiment of the present disclosure.

FIG. 1 illustrates a printed circuit board 100 that utilizes a broadside stack-up, including a core layer 110, a pre-impregnated composite fiber (pre-preg) layer 120, and a second core layer 130. Core layers 110 and 130 represent two-sided copper-clad laminate layers upon which circuit traces are etched. Pre-preg layer 120 represents a laminate layer that does not include circuit traces, and that provides separation between the circuit traces of core layers 110 and 130. An example of a laminate layer includes an epoxy laminate, a composite fiber laminate, a FR-2 laminate, a FR-4 laminate, or another laminate material, as needed or desired, and can include a composite fiber matrix such as fiberglass cloth, carbon fiber matrix, that is pre-impregnated with the laminate material. Core layer 110 includes a power plane 112, and a circuit trace 114. Core layers 110 and 130 have a dielectric constant, also referred to as a relative permeability, given by $\in_{core}$, and pre-preg layer 120 has a dielectric constant given by $\in_{pre-preg}$. Core layer 130 includes a power plane 132, and a circuit trace 134. Power planes 112 and 132 represent the nodes of a power supply including a positive supply voltage (V+) associated with power plane 112 and a reference supply voltage (GND) associated with power plane 132. Circuit traces 114 and 134 represent signal carrying traces for different signals in an information handling system that is instantiated on printed circuit board 100. Circuit traces 114 and 134 will be understood to be viewed edge-on, and will extend into printed circuit board 100, passing to one or more surfaces of the printed circuit board to connect to devices which terminate the circuit traces. In a particular embodiment, one or more of circuit traces 114 and 134 are routed angularly, that is, in a zigzag pattern. Circuit trace 114 is illustrated as being a victim trace, and circuit trace 134 is illustrated as being an aggressor trace, however, the designation of victim and aggressor is arbitrary for the purpose of this disclosure.

Figure 2:
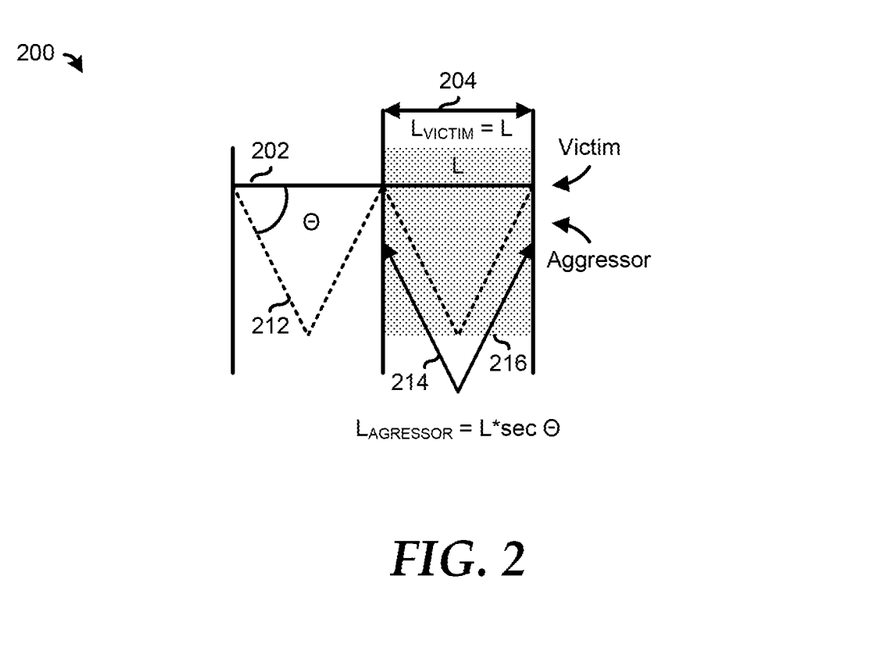
FIG. 2 is a top view of a printed circuit board that utilizes a broadside stack-up according to an embodiment of the present disclosure.

FIG. 2 illustrates exemplary trace routings 200 of circuit traces on a printed circuit board similar to printed circuit board 100. Trace routing 200 illustrates a victim trace 202 that is a straight routing that has a unit cell length 204 ($L_{VICTIM}$) that is equal to L, as described below. Trace routing 200 also illustrates an aggressor trace 212 that is angularly routed, with a routing angle of θ. A unit cell 216 of aggressor trace 212 is shown as encompassing a single cycle of the trace layout and has a cell length of L. Thus, for convenience, the unit cell length of victim trace 202 is set to be the same as the unit cell length of aggressor trace 212. Thus, given a routing angle of θ, and a unit cell length of L, it will be understood that a unit cell length 214 of aggressor trace is given as:

$$L_{AGGRESSOR}=L*\sec\theta \qquad \text{Equation 1}$$

Other trace routings can be utilized as needed or desired. For example, a pair of trace routings can each be provided that utilize angular routing, where each trace has a different routing angle, such as $\theta_{VICTIM}$ and $\theta_{AGGRESSOR}$, and where each trace has a different unit cell length, such as $L_{VICTIM}$ and $L_{AGGRESSOR}$.

Figure 3:
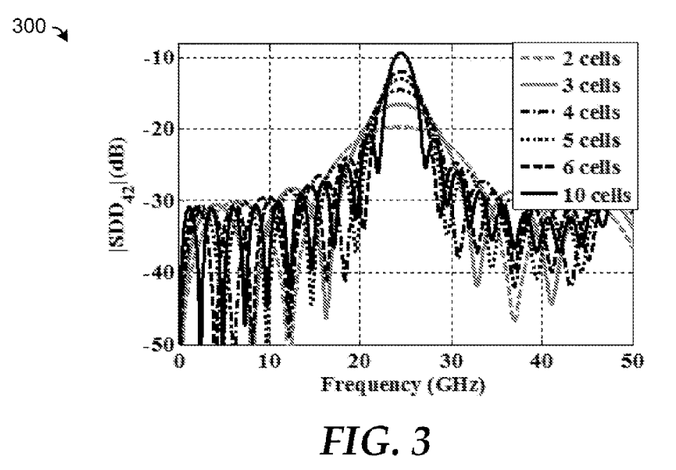
FIG. 3 is a chart of floquet frequency coupling in the printed circuit board of FIG. 2.

In a particular embodiment, the floquet mode coupling in trace routings 200 can be determined by applying a field solver that evaluates the electromagnetic interactions between traces 202 and 212. Such a field solver can analyze such factors including the geometry of traces 202 and 212, the spacings between the traces, the overall length of the traces, the dielectric constant of the laminate layers that make up the printed circuit board, and the like, to determine if the traces will meet a particular design specification. The design specification can include recommended or required values for maximum insertion loss, cross talk, and the like. If traces 202 and 212 do not meet the design specification, then a designer can re-layout the traces to improve their performance. In a particular embodiment, an analysis of traces 202 and 212 can provide a floquet coupling transmission diagram such as is shown in FIG. 3, where the floquet frequency for an exemplary circuit trace is shown to be approximately 25 gigahertz (GHz). Here, if the operating frequency of the exemplary circuit trace is expected to be near to the floquet frequency, then the designer may consider redesigning the circuit trace in order to minimize the floquet coupling with the circuit trace.

Figure 4:
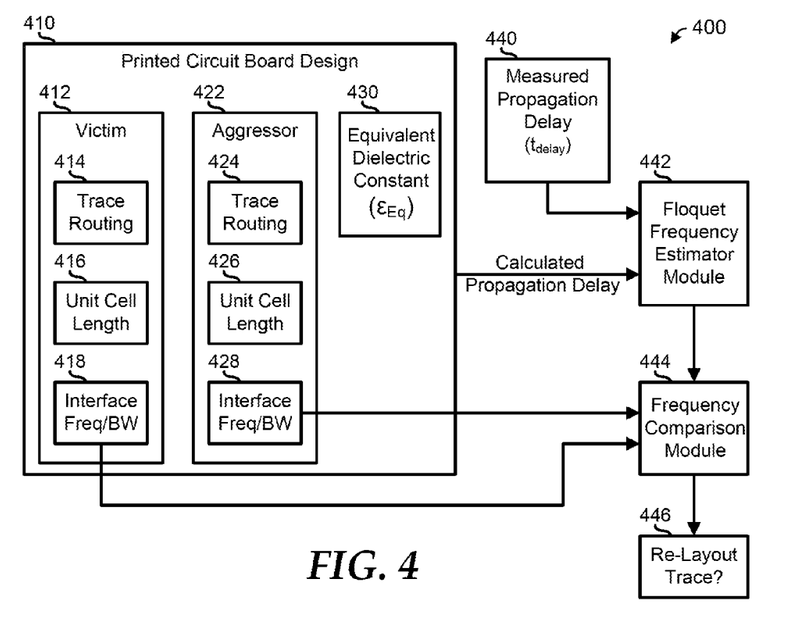
FIG. 4 is a block diagram of a resonance estimating system according to an embodiment of the present disclosure.

FIG. 4 illustrates an embodiment of a resonance estimating system 400 including a printed circuit board design input module 410, a propagation delay input module 440, a floquet frequency estimator module 442, a frequency comparison module 444, and a trace re-layout module 446. Design input module 410 represents a design depiction of a printed circuit board layout for an information handling system, and can include information related to circuit layout, device placement, and trace routing for the information handling system. As such, design input module 410 can include information regarding multiple circuit traces, in addition to the traces that are designated as victim and aggressor. Thus, the victim trace and the aggressor trace can be selected as being typical of a larger group of similarly designed traces on the printed circuit board. Design input module 410 includes a victim trace design 412, an aggressor trace design 422, and an equivalent dielectric constant value 430. Victim trace design 412 includes a trace routing 414, a unit cell length 416, and an interface frequency 418. Similarly, Aggressor trace design 212 includes a trace routing 424, a unit cell length 426, and an interface frequency 428. Equivalent dielectric constant value 430 represents an equivalent dielectric constant value for the printed circuit board design that accounts for the differences in the dielectric constant of a core material of the printed circuit board and a pre-preg material of the printed circuit board. In a particular embodiment, equivalent dielectric constant value 430 is determined by taking an average of the dielectric constant of the core material of the printed circuit board and the dielectric constant of the pre-preg material of the printed circuit board. In another embodiment, equivalent dielectric constant value 430 is determined as a byproduct of a field solver analysis of the printed circuit board design, and can yield a more accurate value for the equivalent dielectric constant of the printed circuit board. In yet another embodiment, equivalent dielectric constant value 430 is further determined based upon interface frequencies 418 and 428, in order to yield a yet more accurate value for the equivalent dielectric constant of the printed circuit board. The skilled artisan will recognize that the dielectric constant of many common printed circuit board laminate materials are found to be in the range of 3.5 to 4.5. Thus, for the purpose of further illustration, equivalent dielectric constant value 430 will be assumed to be 4.

Design input module 410 is utilized to determine a propagation delay for signals associated with the victim trace and the aggressor trace through a unit cell, as:

$$t_{delay} = \frac{l_{avg}}{v} \qquad \text{Equation 2}$$

where $t_{delay}$ is the propagation delay, $l_{avg}$ is the average of the unit cell lengths of the victim trace and the aggressor trace, that is:

$$l_{avg} = \frac{l_{victim} + l_{aggressor}}{2} \qquad \text{Equation 3}$$

as can be determined using Equation 1, above, and v is the propagation speed of the printed circuit board material. The propagation speed v is given as:

$$v = \frac{C}{\sqrt{\varepsilon_{eq}}} \qquad \text{Equation 4}$$

where C is the speed of light in a vacuum, and $\varepsilon_{eq}$ is equal to equivalent dielectric constant value 430. For example, where the victim trace has unit cell length 416 is 8 millimeters (mm) and the aggressor trace has unit cell length 426 is 4 mm, $l_{avg}$ is determined by Equation 3 to be 6 mm. Further, assuming equivalent dielectric constant value 430 is 4, the propagation speed v is determined by Equation 4 to be $1.5 \times 10^8$ m/sec. Substituting these values into Equation 3 yields a $t_{delay}$ of 40 picoseconds (ps).

In another embodiment, the propagation delay can be directly measured on an exemplary printed circuit board that has the victim trace and the aggressor trace laid out as specified by design input module 410, using a time domain reflectometer on the traces, and operating at the designated interface frequencies 418 and 428. In this way, an actual measurement for the propagation delay of the unit cells of the victim trace and the aggressor trace can be determined, as needed or desired. In another embodiment, the calculated determination of the propagation delay, as described in Equations 2-4, above, is made, and the measurement using the time domain reflectometer is used as a check on the accuracy of the modeled propagation delay.

Floquet frequency estimator module 442 receives the one or more of the calculated propagation delay from design input module 410 and from propagation delay input module 440. Floquet frequency estimator module 442 determines an estimate of the floquet frequency for the victim and aggressor traces as:

$$f_{floquet} = \frac{n}{2 t_{delay}}, \text{ where } n = 1, 2, \ldots \qquad \text{Equation 5}$$

where $f_{floquet}$ is the estimated floquet frequency and n is an integer that identifies the harmonics of the estimated floquet frequency. Frequency comparison module 444 operates to compare the estimated floquet frequency with interface frequencies 418 and 428. If the estimated floquet frequency is close to one or more of interface frequencies 418 and 428, then the configuration is likely to result in unwanted insertion loss and crosstalk, and one or more of the victim trace and the aggressor trace is redesigned in trace re-layout module 446. In a particular embodiment, the estimated floquet frequency is close to one or more of interface frequencies 418 and 428, when the estimated floquet frequency and the interface frequency are within 500 megahertz (MHz) of each other. In another embodiment, the estimated floquet frequency is close to one or more of interface frequencies 418 and 428, when the estimated floquet frequency and the interface frequency are within 2% of each other.

Continuing the above example, where the propagation delay $t_{delay}$ is 40 ps, by substitution into Equation 5, an estimated fundamental floquet frequency is determined to be 25 GHz. Thus, if both the victim trace and the aggressor trace are operating well below the estimated fundamental floquet frequency, such as where the victim trace and the aggressor trace are expected to carry a 10 gigabit Ethernet (GbE) signal, then the trace layouts for the victim trace and the aggressor trace are determined by frequency comparison module 444 to represent a sound design that will not suffer the adverse effects of floquet frequency mode coupling. However, if one of the traces represents, for example, a 25 GbE signal trace, then frequency comparison module 444 will indicate that floquet frequency mode coupling is likely to occur in one or more of the victim trace and the aggressor trace, and trace re-layout module 446 will change one or more of the basic blocks associated with the victim trace and the aggressor trace. For example, trace re-layout module 446 can change the routing angle, the basic block length, or both for one or more of the victim trace and the aggressor trace.

Figure 5:
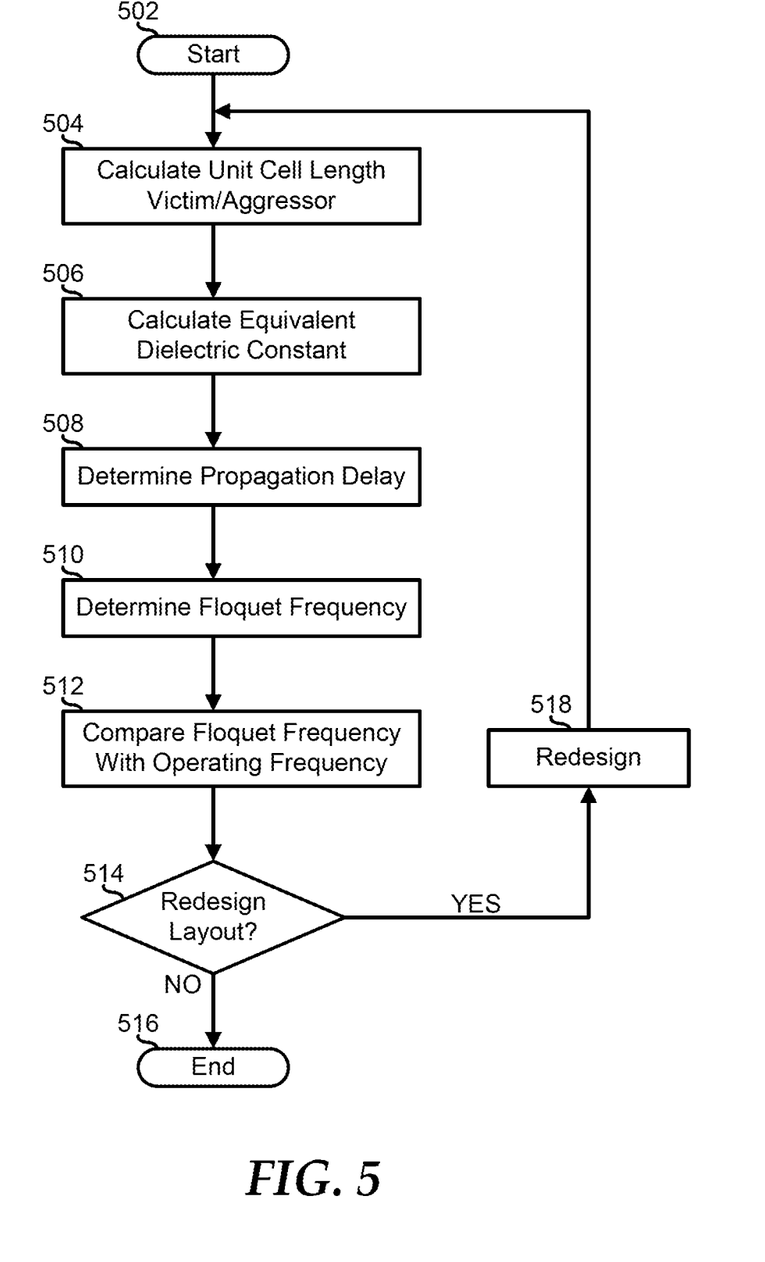
FIG. 5 is a method of determining high speed resonance due to coupling from broadside layers.

FIG. 5 illustrates a method of determining high speed resonance due to coupling from broadside layers starting at block 502. Trace lengths for one or more unit cell of an angularly routed circuit trace in a printed circuit board are calculated in block 504. For example, an angularly routed trace can have a unit cell length and a routing angle, and the trace length can be determined as shown in Equation 1. An equivalent dielectric constant is calculated for the printed circuit board in block 506. Here, an average of the dielectric constants for core layers and for pre-preg layers can be used, or a more accurate calculation of the equivalent dielectric constant can be generated.

A propagation delay for the traces is determined in block 508. For example, given the unit cell lengths of the victim trace and the aggressor trace from block 504, and the equivalent dielectric constant from block 506, the propagation delay can be determined using Equations 2-4, or the propagation delay can be measured using a time domain reflectometer. Given the propagation delay from block 508, the floquet frequency for the trace routing is determined using Equation 5 in block 510. The floquet frequency is compared with the operating frequency for the traces in block 512. For example the interface frequencies 418 and 428 can be compared with the floquet frequency. A decision is made as to whether or not to redesign the layout based on the floquet frequency and the operating frequencies for the traces in block 514. If not, the "NO" branch of decision block 514 is taken and the method ends in block 516. If the decision is to redesign the layout based on the floquet frequency and the operating frequencies for the traces, "YES" branch of decision block 514 is taken, the layout of one or more of the traces is done in block 518, and the method returns to block 504 where the trace lengths are recalculated.

Figure 6:
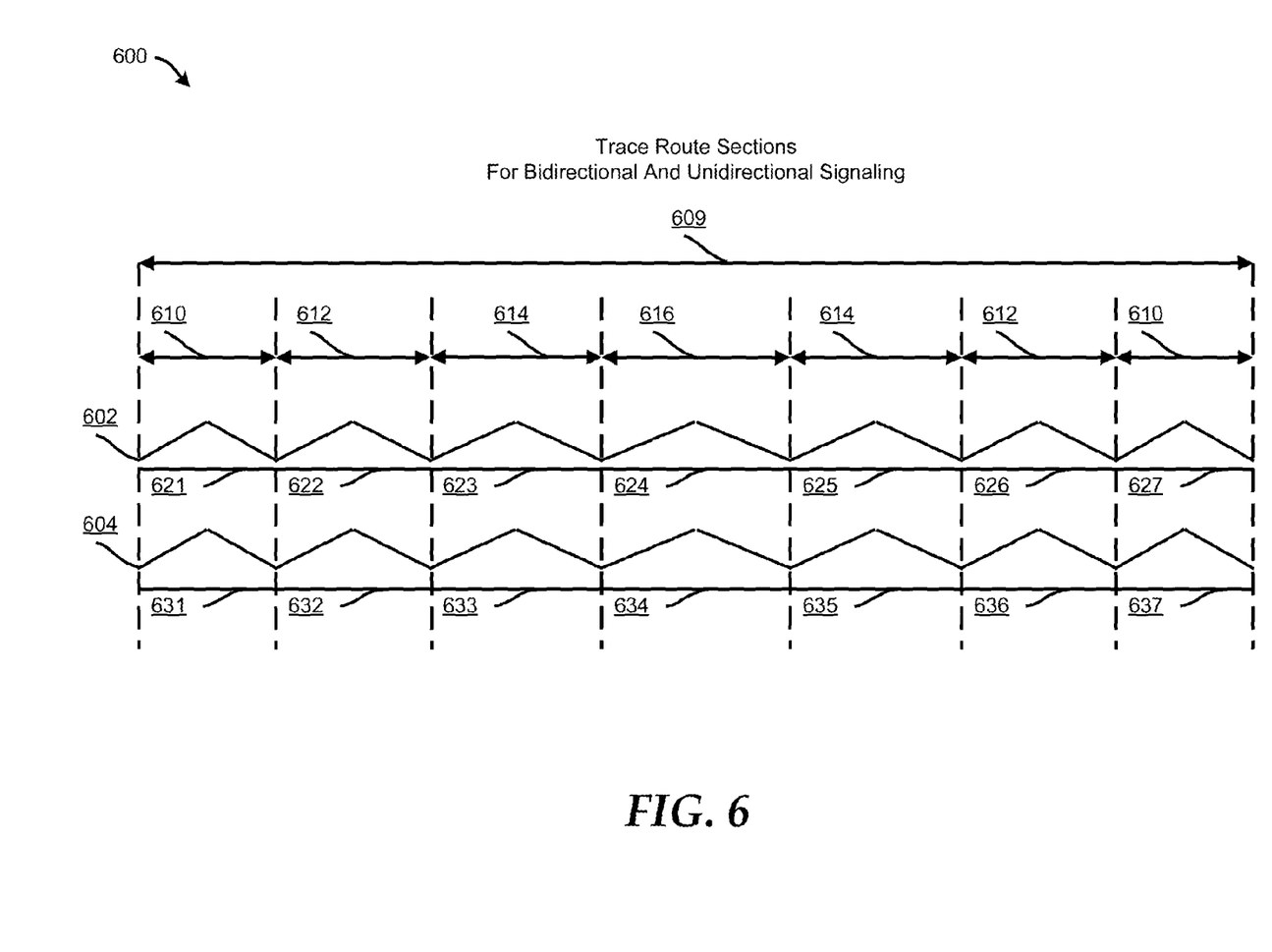
FIG. 6 is a block diagram illustrating signal route sections that utilize broadside stack-up for bidirectional and unidirectional signaling according to an embodiment of the present disclosure.
Figure 9:
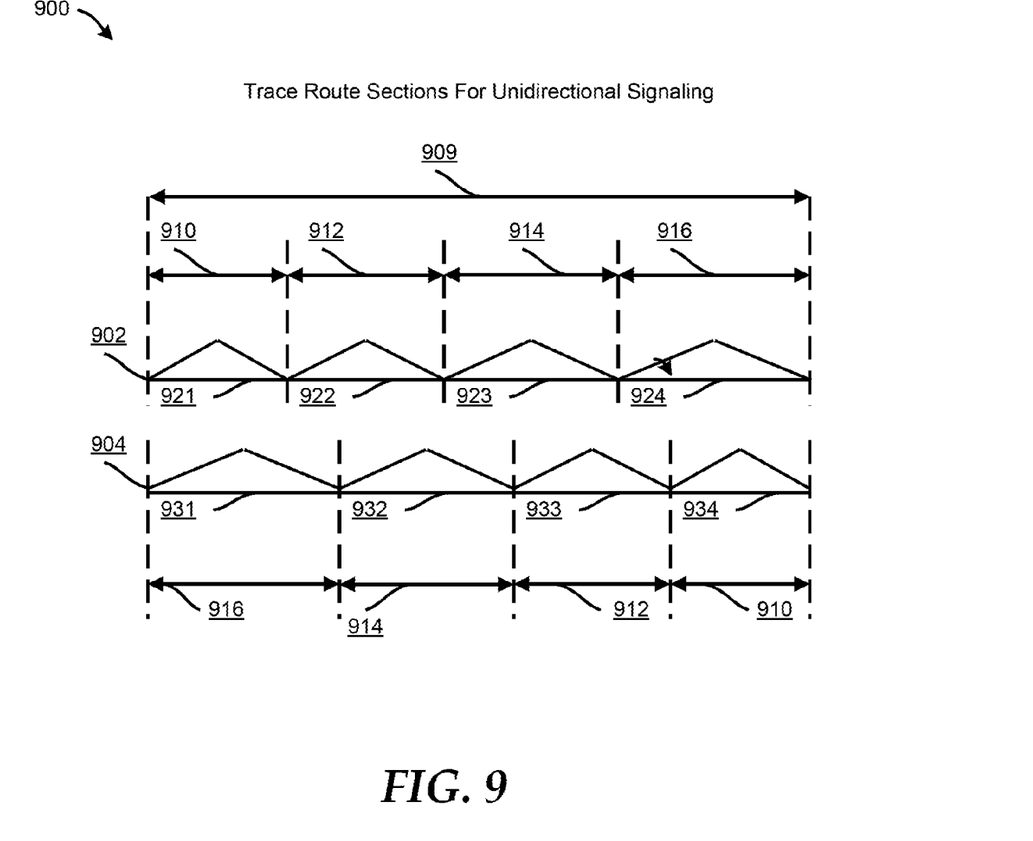
FIG. 9 is another block diagram illustrating signal route sections that utilize broadside stack-up for unidirectional signaling according to an embodiment of the present disclosure.

FIGS. 6 and 9 illustrate trace routes that include traces that utilize broadside stack-up and angular routing for bidirectional and unidirectional signaling. The traces include multiple trace sections that are each characterized by a particular unit cell length. The traces provide for the transmission and reception of a plurality of diverse microwave frequency signals, high-speed digital signals, and high-speed analogue signals. A trace route includes a signal transmitter, a signal receiver, and the multiple trace sections to mitigate floquet mode resonances, according to embodiments of the present disclosure.

FIG. 6 shows trace routings 600 having multiple trace route sections that utilize broadside stack-up for bidirectional signaling including trace route sections 602 and 604 that are illustrated in a plane view. Trace route sections 602 and 604 can represent a differential pair for differential signaling or a unidirectional pair for unidirectional signaling. It will be understood that trace routings 600 are illustrative of circuit traces between devices or elements that transmit data, such as a transmitter on one end and a receiver on the other end where the trace routings are unidirectional, or such as transceivers on both ends where the trace routings are bidirectional. Also, a trace length between the devices or elements can include one unit cell or multiple unit cells, as needed or desired. Thus, as shown hereinafter, a unit cell can be understood to represent multiple unit cells in a trace routing, or a portion thereof, as needed or desired. Each trace route section 602 and 604 has a trace length 609. Trace route section 602 includes one or more unit cells that have different unit cell lengths including unit cells 621, 622, 623, 624, 625, 626, and 627, having unit cell lengths 610, 612, 614, 616, 614, 612, and 610, respectively. Trace route section 604 includes one or more unit cells including unit cells 631, 632, 633, 634, 635, 636, and 637, having unit cell lengths 610, 612, 614, 616, 614, 612, and 610, respectively. Here unit cell length 610 is shorter than unit cell length 612, which in turn is shorter than unit cell length 614, which in turn is shorter than unit cell length 616.

In a particular embodiment, one or more of trace route sections 602 and 604 are routed angularly as illustrated, or substantially angularly, that is, in a zigzag pattern, where the distance from the center of the base of the triangle formed to each point of the substantially equals sides of the triangle may vary between 0% and 10% due to manufacturing tolerances when forming trace route sections 602 and 604.

In another particular embodiment, trace route sections 602 and 604 are broadside stack-up traces of a printed circuit board, such as, for example, printed circuit board 100, where trace route section 602 is a circuit trace within layer 110 of printed circuit board 100 and trace route section 604 is a circuit trace within layer 130 of printed circuit board 100. In an example, trace route sections 602 and 604 can occur at a neck-down region of printed circuit board 100 that is routed between a ball grid array via grid for a device in the neck down region. In other examples, trace route sections 602 and 604 can occur at a breakout region, a bump-out trace region, a congested trace region, and the like of printed circuit board 100. In yet another particular embodiment, trace route sections 602 and 604 can be trace route sections of an integrated circuit of a die, a package, and the like that are utilized for bidirectional and unidirectional signaling.

Figure 7:
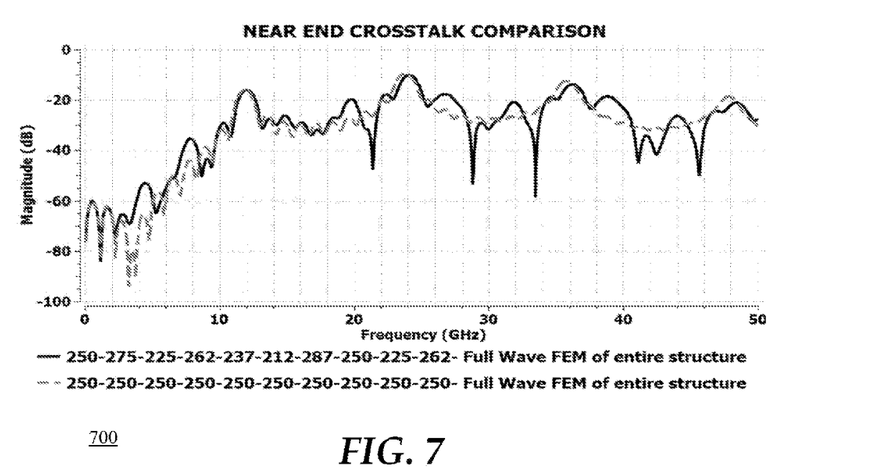
FIG. 7 is a chart of floquet frequency coupling illustrating that trace route sections having random unit cell lengths will not mitigate floquet modes according to an embodiment of the present disclosure.

In a particular embodiment, an analysis of a particular trace route section including ten unit cells having random unit cell lengths of 250 mils, 275 mils, 225 mils, 262 mils, 237 mils, 212 mils, 287 mils, 250 mils, 225 mils, and 262 mils, respectively, can provide a floquet coupling transmission diagram 700 such as is shown in FIG. 7, where the particular trace route section is to mitigate the floquet modes due to aggressor circuit traces modes by varying the unit cell lengths of the particular trace route section. The floquet coupling transmission diagram 700 compares the particular trace route section to another trace route section that is configured to have ten unit cells, where each unit cell has a unit cell length of 250 mils has floquet modes due to the aggressor circuit traces modes. Here, the arrangement of the particular trace route section structure shown in FIG. 7 was assembled in order to mitigate resonances observed when all 10 unit cells are equal length of 250 mils. Instead of mitigating, it created new resonances along with the original resonances.

Trace route sections 602 and 604 are configured in ascending order of unit cell length from an initial unit cell through a middle unit cell, e.g. unit cell 624 having unit cell length 616, and in descending order of unit cell length from the middle unit cell through an end unit cell to mitigate the floquet modes due to aggressor circuit traces. Aggressor circuit traces may be straight, angularly routed using random unit cell lengths, or angularly routed using the same unit cell lengths as trace route sections 602 and 604. The unit cell length of the initial and end unit cells is based on the highest frequency to be filtered, e.g. 8 Gbps. The minimum unit cell length is further based on a minimum route limit that includes different unit cells with different unit cell lengths and angles of, e.g. a trace route section of printed circuit board 100. The unit cell length of the middle unit cell is based on the fiber weave effect, where the fiber weave effect is due to different signal propagation properties due to the non-homogeneous medium of the woven fiberglass fabrics of the printed circuit board, referred herein as the fiber weave effect, which can become a source of increased crosstalk and electromagnetic interference. The number of unit cells of a trace route section can be based on a multiple of the unit cell length of the initial unit cell and a total of the unit cell lengths of the trace route section, though the number of unit cells does not need to be an exact multiple of the unit cell length of the initial unit cell length. In the exemplary embodiment, seven unit cells are shown for trace route sections 602 and 604 of trace routings 600. When trace route sections 602 and 604 are trace route sections of a printed circuit board, e.g. printed circuit board 100, unit cell lengths 610, 612, 614, and 616 can be 30 mils, 100 mils, 250 mils, and 370 mils, respectively, and the total length 609 is thirteen inches using the flowchart of FIG. 5 and the design equations described above.

Figure 8:
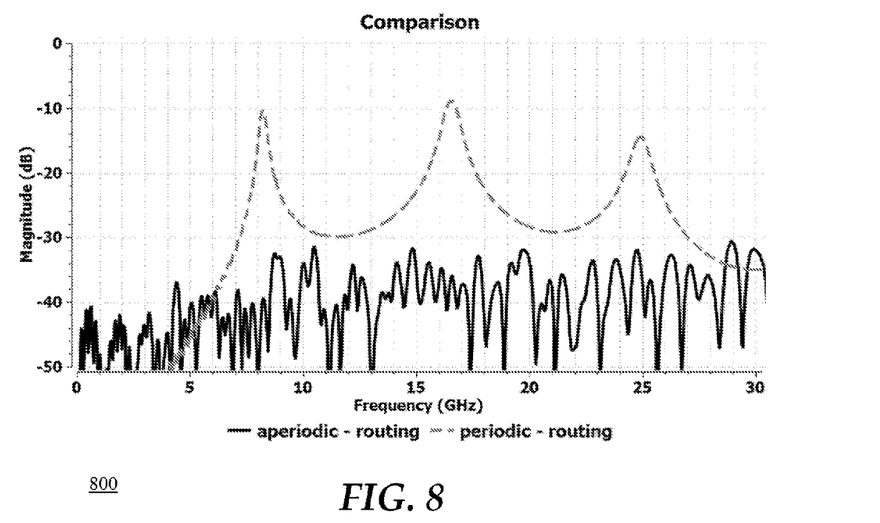
FIG. 8 is a chart of floquet frequency coupling illustrating a comparison of trace route sections according to an embodiment of the present disclosure.

In a particular embodiment, an analysis of the proposed routing can provide a floquet coupling transmission diagram 800 such as is shown in FIG. 8, where the proposed routing is compared to other trace route sections that are configured to mitigate the floquet modes due to aggressor circuit traces by having seven unit cells, each unit cell having a unit cell length of 370 mils, and their total length is thirteen inches. Here, the arrangement of trace route sections 602 and 604 negates the floquet modes created using only the other trace route sections that have 370 mil unit cell lengths.

FIG. 9 shows trace routings 900 that have similar structure and provide similar functionality as trace routings 600, previously described, which can be utilized for unidirectional signaling. Trace routings 900 includes trace route sections 902 and 904 that are illustrated in a plane view. Each trace route section 902 and 904 has a trace length 609. Trace route section 902 includes one or more unit cells that have different unit cell lengths including unit cells 921, 922, 923, and 924, having unit cell lengths 910, 912, 914, and 916, respectively. Trace route section 904 includes one or more unit cells including unit cells 931, 932, 933, and 934, having unit cell lengths 916, 914, 912, and 910, respectively. Here unit cell length 910 is shorter than unit cell length 912, which in turn is shorter than unit cell length 914, which in turn is shorter than unit cell length 916. Trace route section 902 is configured in ascending order of unit cell lengths from an initial unit cell, e.g. unit cell 921 having unit cell length 910, through an end unit cell, e.g. unit cell 924 having unit cell length 916, and trace route section 904 is configured in descending order of unit cell lengths from an initial unit cell, e.g. unit cell 931 having unit cell length 916, through an end unit cell, e.g. unit cell 934 having unit cell length 910. The arrangement of trace route sections 902 and 904 of trace routings 900 mitigates the floquet modes due to aggressor circuit traces.

By configuring trace route sections of trace routes in the manner described above, resonances in near-end crosstalk (NEXT) and nulls in insertion loss (THRU) transfer functions as a consequence of floquet modes is mitigated. Coupling that also introduces floquet modes into the crosstalk transfer function and the jitter introduced by the aggregate effect of aggressor trace routes on the victim trace eye opening are also mitigated, e.g. the jitter budget at data rates above 8 Gbps is increased.

Figure 10:
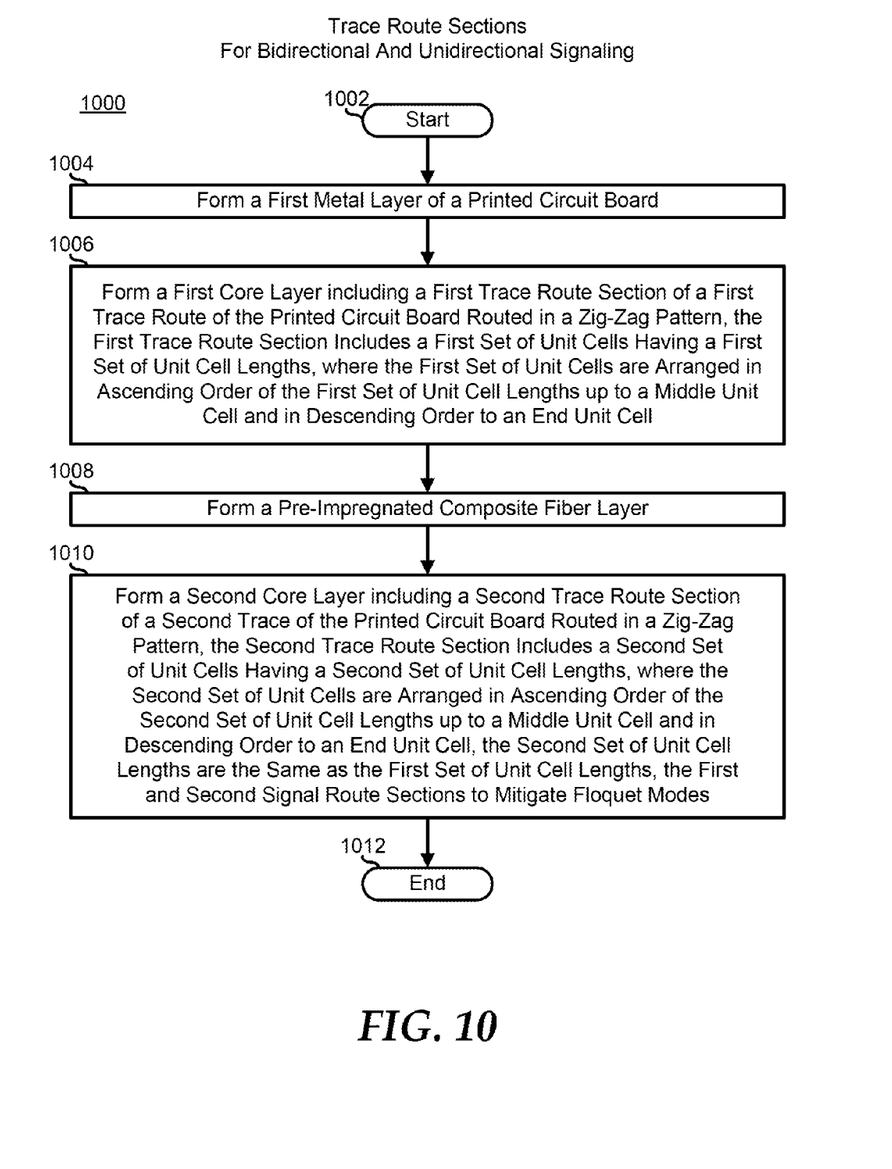
FIG. 10 is a method of forming signal route sections that utilize broadside stack-up for bidirectional and unidirectional signaling within a printed circuit board.

FIG. 10 illustrates a method 1000 of forming trace routes that utilize broadside stack-up for bidirectional and unidirectional signaling within a printed circuit board, where the exemplary method 1000 starts at block 1002. At block 1004, a first metal layer of a printed circuit board is formed.

At block 1006, a first core layer including a first trace route section of a first trace route of the printed circuit board routed in a zig-zag pattern is formed. The first trace route section includes a first set of unit cells having a first set of unit cell lengths, where the first set of unit cells are arranged in ascending order of the first set of unit cell lengths up to a middle unit cell and in descending order to an end unit cell. At block 1008, a pre-impregnated composite fiber layer is formed.

At block 1010, a Second Core Layer including a second trace route section that is routed in an angular/Zig-Zag pattern of a second trace route of the printed circuit board is formed. The second trace route section includes a second set of unit cells having a second set of unit cell lengths, where the second set of unit cells are arranged in ascending order of the second set of unit cell lengths up to a middle unit cell and in descending order to an end unit cell, the second set of unit cell lengths are the same as the first set of unit cell lengths, the first and second trace route sections to mitigate floquet modes. In an embodiment, method 1000 can be used to form trace route sections for unidirectional signaling within an integrated circuit of a die, a package, and the like.

Figure 11:
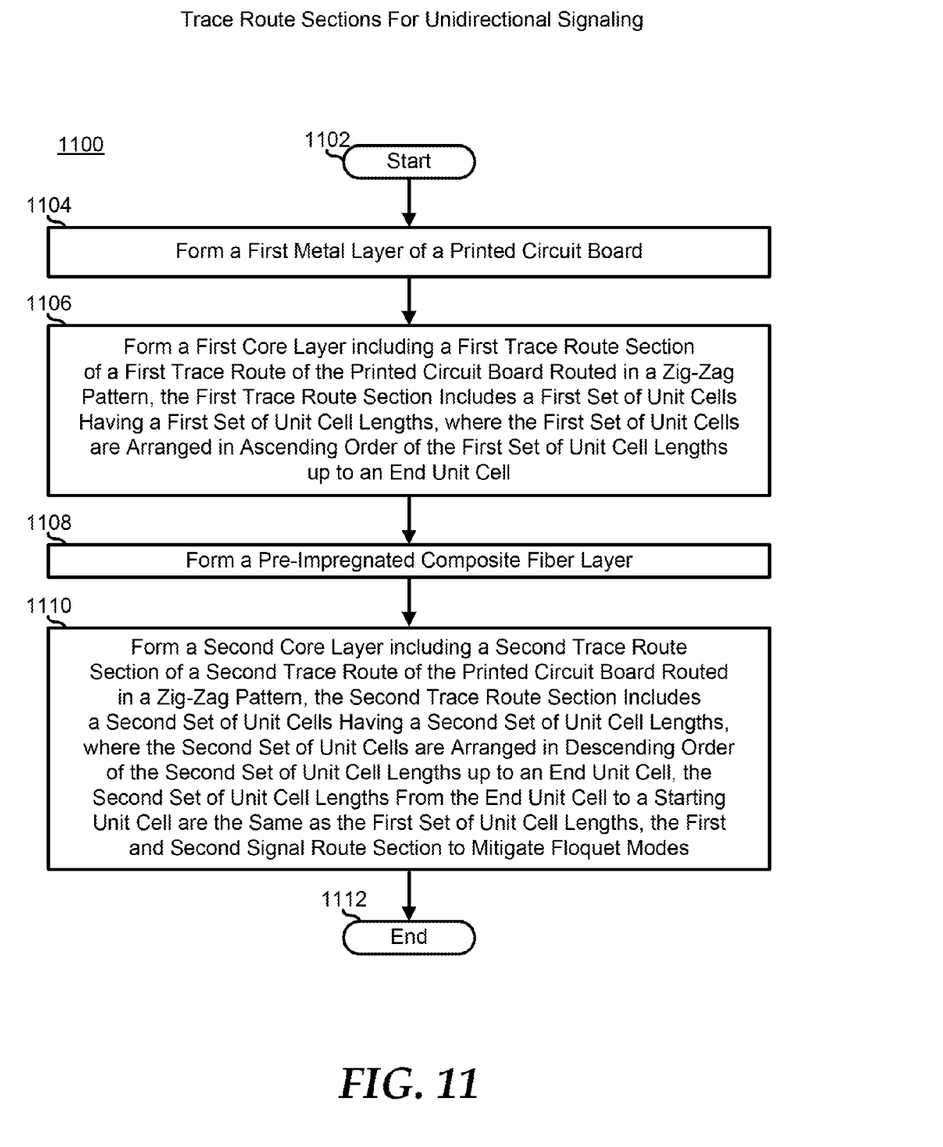
FIG. 11 is another method of forming signal route sections that utilize broadside stack-up for unidirectional signaling within a printed circuit board.

FIG. 11 illustrates another method 1100 of forming trace routes that utilize broadside stack-up for unidirectional signaling within a printed circuit board, where the exemplary method 1100 starts at block 1102. At block 1104, a first metal layer of a printed circuit board is formed.

At block 1106, a first core layer including a first trace route section of a first trace route routed in an angular/Zig-Zag pattern of the printed circuit board is formed. The first trace route section includes a first set of unit cells having a first set of unit cell lengths, where the first set of unit cells are arranged in ascending order of the first set of unit cell lengths up to an end unit cell. At block 1108, a pre-impregnated composite fiber layer is formed.

At block 1110, a second core layer including a second trace route section of a second trace route routed in an angular/Zig-Zag pattern of the printed circuit board is formed. The second trace route section includes a second set of unit cells having a second set of unit cell lengths, where the second set of unit cells are arranged in descending order of the second set of unit cell lengths up to an end unit cell, the second set of unit cell lengths from the end unit cell to a starting unit cell are the same as the first set of unit cell lengths, the first and second trace route sections to mitigate floquet modes due to aggressor circuit traces. In an embodiment, method 1100 can be used to form trace route sections for unidirectional signaling within an integrated circuit of a die, a package, and the like.

Figure 12:
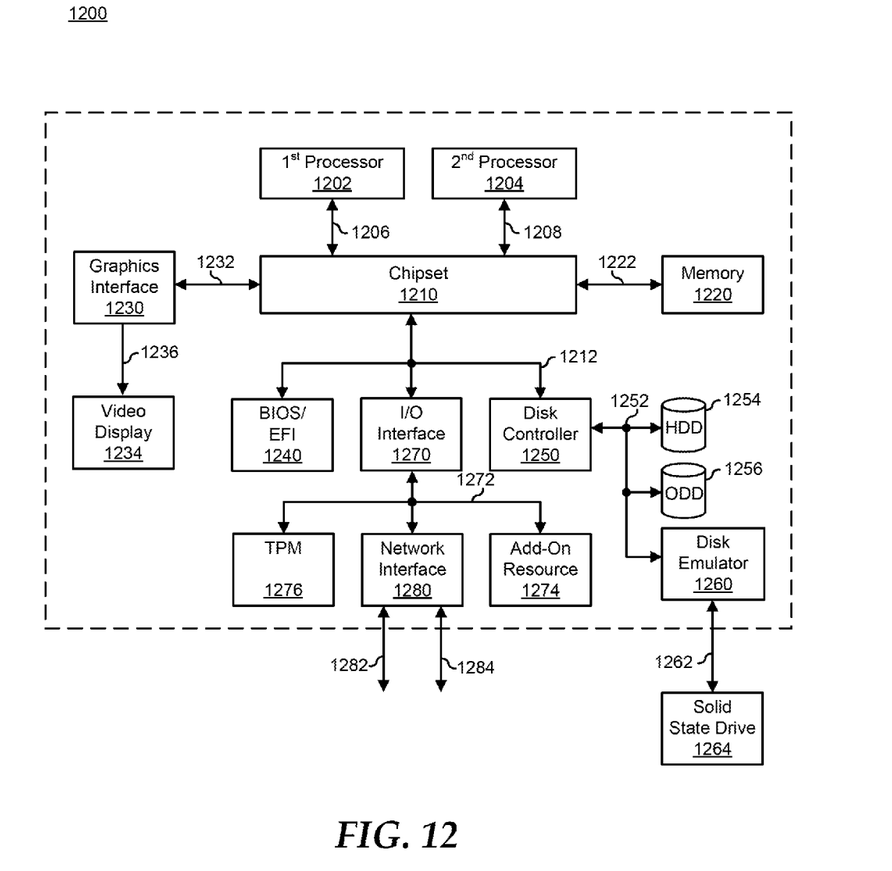
FIG. 12 is a block diagram illustrating a generalized information handling system according to an embodiment of the present disclosure.

FIG. 12 illustrates a generalized embodiment of information handling system 1200. For purpose of this disclosure information handling system 1200 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 1200 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 1200 can include processing resources for executing machine-executable code, such as a central processing unit (CPU), a programmable logic array (PLA), an embedded device such as a System-on-a-Chip (SoC), or other control logic hardware. Information handling system 1200 can also include one or more computer-readable medium for storing machine-executable code, such as software or data. Additional components of information handling system 1200 can include one or more storage devices that can store machine-executable code, one or more communications ports for communicating with external devices, and various input and output (I/O) devices, such as a keyboard, a mouse, and a video display. Information handling system 1200 can also include one or more buses operable to transmit information between the various hardware components.

Information handling system 1200 can include devices or modules that embody one or more of the devices or modules described above, and operates to perform one or more of the methods described above. Information handling system 1200 includes a processors 1202 and 1204, a chipset 1210, a memory 1220, a graphics interface 1230, include a basic input and output system/extensible firmware interface (BIOS/EFI) module 1240, a disk controller 1250, a disk emulator 1260, an input/output (I/O) interface 1270, and a network interface 1280. Processor 1202 is connected to chipset 1210 via processor interface 1206, and processor 1204 is connected to the chipset via processor interface 1208. Memory 1220 is connected to chipset 1210 via a memory bus 1222. Graphics interface 1230 is connected to chipset 1210 via a graphics interface 1232, and provides a video display output 1236 to a video display 1234. In a particular embodiment, information handling system 1200 includes separate memories that are dedicated to each of processors 1202 and 1204 via separate memory interfaces. An example of memory 1220 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 1240, disk controller 1250, and I/O interface 1270 are connected to chipset 1210 via an I/O channel 1212. An example of I/O channel 1212 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 1210 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/EFI module 1240 includes BIOS/EFI code operable to detect resources within information handling system 1200, to provide drivers for the resources, initialize the resources, and access the resources. BIOS/EFI module 1240 includes code that operates to detect resources within information handling system 1200, to provide drivers for the resources, to initialize the resources, and to access the resources.

Disk controller 1250 includes a disk interface 1252 that connects the disc controller to a hard disk drive (HDD) 1254, to an optical disk drive (ODD) 1256, and to disk emulator 1260. An example of disk interface 1252 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 1260 permits a solid-state drive 1264 to be connected to information handling system 1200 via an external interface 1262. An example of external interface 1262 includes a USB interface, an IEEE 1394 (Firewire) interface, a proprietary interface, or a combination thereof. Alternatively, solid-state drive 1264 can be disposed within information handling system 1200.

I/O interface 1270 includes a peripheral interface 1272 that connects the I/O interface to an add-on resource 1274, to a TPM 1276, and to network interface 1280. Peripheral interface 1272 can be the same type of interface as I/O channel 1212, or can be a different type of interface. As such, I/O interface 1270 extends the capacity of I/O channel 1212 when peripheral interface 1272 and the I/O channel are of the same type, and the I/O interface translates information from a format suitable to the I/O channel to a format suitable to the peripheral channel 1272 when they are of a different type. Add-on resource 1274 can include a data storage system, an additional graphics interface, a network interface card (NIC), a sound/video processing card, another add-on resource, or a combination thereof. Add-on resource 1274 can be on a main circuit board, on separate circuit board or add-in card disposed within information handling system 1200, a device that is external to the information handling system, or a combination thereof.

Network interface 1280 represents a NIC disposed within information handling system 1200, on a main circuit board of the information handling system, integrated onto another component such as chipset 1210, in another suitable location, or a combination thereof. Network interface device 1280 includes network channels 1282 and 1284 that provide interfaces to devices that are external to information handling system 1200. In a particular embodiment, network channels 1282 and 1284 are of a different type than peripheral channel 1272 and network interface 1280 translates information from a format suitable to the peripheral channel to a format suitable to external devices. An example of network channels 1282 and 1284 includes InfiniBand channels, Fibre Channel channels, Gigabit Ethernet channels, proprietary channel architectures, or a combination thereof. Network channels 1282 and 1284 can be connected to external network resources (not illustrated). The network resource can include another information handling system, a data storage system, another network, a grid management system, another suitable resource, or a combination thereof.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A trace route comprising:
 a first signal route to couple a first signal transmitter to a first signal receiver, the first signal route including:
  a first signal route section coupled to the transmitter and configured in a first zig-zag pattern, the first zig-zag pattern comprising a first unit cell having a first unit cell length, wherein a minimum limit of the first unit cell length is based on a highest frequency to be filtered;
  a second signal route section connected between the first signal route section and the receiver, and configured in a second zig-zag pattern, the second zig-zag pattern comprising a second unit cell having a second unit cell length, the first unit cell length is less than the second unit cell length; and
  a third signal route section connected between the second signal route section and the receiver, and configured in a third zig-zag pattern, the third zig-zag pattern comprising a third unit cell having a third unit cell length, wherein the third unit cell length is greater than the second unit cell length.

2. The trace route of claim 1, further comprising:
 a second signal route to couple a second signal transmitter to a second signal receiver, the second signal route including:
  a fourth signal route section coupled to the second transmitter and configured in a fourth zig-zag pattern, the fourth zig-zag pattern comprising a fourth unit cell having a fourth unit cell length; and
  a fifth signal route section connected to the fourth signal route section and coupled to the second receiver, and configured in a fifth zig-zag pattern, the fifth zig-zag pattern comprising a fifth unit cell having a fifth unit cell length, the fourth unit cell length is equal to the first unit cell length and the fifth unit cell length is equal to the second unit cell length.

3. The trace route of claim 2, wherein the first and second signal routes are for bidirectional signaling.

4. The trace route of claim 2, wherein the first and second signal routes are differential signal routes for differential signaling.

5. The trace route of claim 2, wherein the first and second signal routes are for unidirectional signaling.

6. The trace route of claim 2, wherein the first and second signal routes are broadside stack-up signal traces, the first signal route within a first metal layer of a printed circuit board, and the second signal route within a second metal layer of the printed circuit board.

7. The trace route of claim 2, wherein the first and the second signal routes are on a die of an integrated circuit device.

8. The trace route of claim 1, further comprising:
a second signal route to couple a second signal transmitter to a second signal receiver, the second signal route including:
  a fourth signal route section coupled to the second transmitter and configured in a fourth zig-zag pattern, the fourth zig-zag pattern comprising a fourth unit cell having a fourth unit cell length; and
  a fifth signal route section connected to the fourth signal route section and coupled to the second receiver, and configured in a fifth zig-zag pattern, the fifth zig-zag pattern comprising a fifth unit cell having a fifth unit cell length, the fourth unit cell length is equal to the second unit cell length and the fifth unit cell length is equal to the first unit cell length.

9. The trace route of claim 1, wherein a maximum limit of the second unit cell length is based on fiber weave effect.

10. The trace route of claim 1, wherein the minimum limit is further based on a minimum route limit.

11. The trace route of claim 1, wherein a number of unit cells of the first signal route is based on a multiple of the first unit cell length and a length of the number of the unit cells of the first signal route.

12. A method comprising:
forming a first metal layer of a printed circuit board including a first signal route to couple a first signal transmitter to a first signal receiver, the first signal route including:
  a first signal route section coupled to the transmitter and configured in a first zig-zag pattern, the first zig-zag pattern comprising a first unit cell having a first unit cell length; and
  a second signal route section connected to the first signal route section and coupled to the receiver, and configured in a second zig-zag pattern, the second zig-zag pattern comprising a second unit cell having a second unit cell length, the first unit cell length is less than the second unit cell length, wherein a maximum limit of the second unit cell length is based on fiber weave effect.

13. The method of claim 12, further comprising:
forming a pre-impregnation layer of the printed circuit board; and
forming a second metal layer of the printed circuit board including a second signal route to couple a second signal transmitter to a second signal receiver, the second signal route including:
  a fourth signal route section coupled to the second transmitter and configured in a fourth zig-zag pattern, the fourth zig-zag pattern comprising a fourth unit cell having a fourth unit cell length; and
  a fifth signal route section connected to the fourth signal route section and coupled to the second receiver, and configured in a fifth zig-zag pattern, the fifth zig-zag pattern comprising a fifth unit cell having a fifth unit cell length, the fourth unit cell length is equal to the first unit cell length, the fifth unit cell length is equal to the second unit cell length, and the pre-impregnation layer is formed between the first and second metal layers of the printed circuit board.

14. A trace route comprising:
a first signal route to couple a first signal transmitter to a first signal receiver, the first signal route including:
  a first signal route section coupled to the transmitter and configured in a first zig-zag pattern, the first zig-zag pattern comprising a first unit cell having a first unit cell length wherein a minimum limit of the first unit cell length is based on a highest frequency to be filtered; and
  a second signal route section connected to the first signal route section and coupled to the receiver, and configured in a second zig-zag pattern, the second zig-zag pattern comprising a second unit cell having a second unit cell length, the first unit cell length is less than the second unit cell length; and
a second signal route to couple a second signal transmitter to a second signal receiver, the second signal route including:
  a fourth signal route section coupled to the second transmitter and configured in a fourth zig-zag pattern, the fourth zig-zag pattern comprising a fourth unit cell having a fourth unit cell length; and
  a fifth signal route section connected to the fourth signal route section and coupled to the second receiver, and configured in a fifth zig-zag pattern, the fifth zig-zag pattern comprising a fifth unit cell having a fifth unit cell length, the fourth unit cell length is equal to the first unit cell length and the fifth unit cell length is equal to the second unit cell length.

15. The trace route of claim 14, wherein the first and second signal routes are for bidirectional signaling.

16. The trace route of claim 14, wherein the first and second signal routes are for unidirectional signaling.

* * * * *